(12) United States Patent  
Sasaki

(10) Patent No.: US 8,446,207 B2
(45) Date of Patent: May 21, 2013

(54) LOAD DRIVING CIRCUIT

(75) Inventor: Kazuki Sasaki, Niiza (JP)

(73) Assignee: Sanken Electric Co., Ltd., Saitama (JP)

( * ) Notice: Subject to any disclaimer, the term of this patent is extended or adjusted under 35 U.S.C. 154(b) by 0 days.

(21) Appl. No.: 13/299,034

(22) Filed: Nov. 17, 2011

(65) Prior Publication Data

US 2012/0126861 A1 May 24, 2012

(30) Foreign Application Priority Data

Nov. 19, 2010 (JP) ................................ 2010-259033

(51) Int. Cl.
*H03K 17/687* (2006.01)
(52) U.S. Cl.
USPC ............ 327/434; 327/377; 327/384; 327/389
(58) Field of Classification Search
USPC .................. 327/108, 309, 310, 323, 374, 377, 327/379, 381, 384, 389, 403, 427, 434, 70
See application file for complete search history.

(56) References Cited

U.S. PATENT DOCUMENTS

| 4,634,896 | A | * | 1/1987 | Shrinkle | 327/76 |
| 5,426,334 | A | * | 6/1995 | Skovmand | 327/427 |
| 5,742,193 | A | * | 4/1998 | Colli et al. | 327/170 |
| 6,204,700 | B1 | * | 3/2001 | Seyed | 327/108 |
| 6,400,203 | B1 | * | 6/2002 | Bezzi et al. | 327/309 |
| 7,741,894 | B2 | * | 6/2010 | Kojima | 327/427 |
| 8,242,830 | B2 | * | 8/2012 | Soma et al. | 327/427 |
| 2003/0180997 | A1 | | 9/2003 | Nakayama et al. | |
| 2010/0134939 | A1 | * | 6/2010 | Takahashi et al. | 361/87 |
| 2011/0007442 | A1 | * | 1/2011 | Fukuhara et al. | 361/88 |

FOREIGN PATENT DOCUMENTS

| JP | 06-291631 A | 10/1994 |
| JP | 2003-284318 A | 10/2003 |

* cited by examiner

*Primary Examiner* — Lincoln Donovan
*Assistant Examiner* — Jung H Kim
(74) *Attorney, Agent, or Firm* — Birch, Stewart, Kolasch & Birch, LLP

(57) ABSTRACT

A load driving circuit in which the off-time Toff and the fall time Tf can be improved in turn-off operation of the N-channel type MOSFET used as a high side switch. The load driving circuit uses an N-channel type power MOSFET as a high side switch connected between a power supply and a load, including a comparator circuit for comparing a gate voltage of the power MOSFET with a power-supply voltage; and a shut-off circuit for discharging the gate terminal of the power MOSFET in turn-off operation of the power MOSFET, the rate of discharging the gate terminal of the power MOSFET performed with the shut-off circuit being set such that the discharge rate provided if the gate voltage Vg is lower than the power-supply voltage Vp is slower than the rate of discharging the same provided if the gate voltage Vg is higher than the power-supply voltage Vp.

1 Claim, 6 Drawing Sheets

LOAD DRIVING CIRCUIT

BACKGROUND OF THE INVENTION

1. Field of the Invention

The present invention relates to a load driving circuit which performs drive control of a load, and particularly relates to a load driving circuit which performs drive control of a load by switching an N-channel type power MOSFET on/off.

2. Description of the Related Art

The N-channel type power MOSFET (hereinafter referred to as the power NMOS) has a low on-resistance, compared to the P-channel type power MOSFET, and is capable of carrying a high current. Accordingly, in spite of the fact that the gate voltage must be increased to above the power-supply voltage, the power NMOS is used also as a high side switch, which drives a load on the power supply side.

FIG. 5 gives an example of a conventional load driving circuit using a power NMOS 2 as a high side switch for driving a load 1, such as a lamp, a solenoid, or the like, and FIG. 6 shows a signal waveform and operation waveforms of the sections in FIG. 5.

To the drain terminal of the NMOS 2, a power supply 3 is connected, and the source terminal of the power NMOS 2 is connected to a ground terminal through the load 1. In addition, the gate terminal of the power NMOS 2 is connected to the output terminal of a voltage step-up circuit 4, and to the junction point between the gate terminal of the power NMOS 2 and the output terminal of the voltage step-up circuit 4, the drain terminal of the NMOS 5 is connected. Further, the source terminal of the NMOS 5 is connected to the ground terminal through the current source 6, while the gate terminal of the NMOS 5 is connected to the output terminal of the drive circuit 7.

Into the input terminal of the voltage step-up circuit 4 and the input terminal of the drive circuit 7, a drive signal Vin for switching the power NMOS 2 on/off is input. The drive signal is a square wave changing between two levels of High and Low. When the drive signal Vin is changed to High, the voltage step-up circuit 4 starts charging the gate terminal until the gate voltage Vg of the power NMOS 2 reaches a voltage level higher than the power-supply voltage of the power supply 3 that is applied to the drain terminal. Thereby, the power NMOS 2 is turned on, being brought into the conducting state (the on state), and current being supplied to the load 1. The voltage step-up circuit 4 functions as a drive circuit for turning the power NMOS 2 on.

On the other hand, the drive circuit 7 is a circuit, such as an inverter, or the like, for outputting a signal obtained by inverting the drive signal Vin, and when the drive signal Vin is changed to Low, the drive circuit 7 drives the NMOS 5 into the conducting state. When the NMOS 5 is driven into the conducting state, the current source 6 discharges the gate terminal of the power NMOS 2. Thereby, the gate voltage Vg is lowered, the power NMOS 2 being turned off to be brought into the non-conducting state (the off state). The NMOS 5, current source 6 and drive circuit 7 function as a shut-off circuit 8.

The turn-off operation of the power NMOS 2 in the conventional load driving circuit will be described in more detail with reference to FIG. 6.

As shown in FIG. 6 (a), when the drive signal Vin is changed to Low at time t1, the NMOS 5 is driven into the conducting state, the current source 6 drawing the charge from the gate terminal of the power NMOS 2, thereby, as shown in FIG. 6 (b), reducing the gate voltage Vg of the power NMOS 2 over a time period of time t1 to t3. When the gate voltage Vg is reduced to close to the threshold voltage Vth of the power NMOS 2, the power NMOS 2 is turned off, thereby, as shown in FIG. 6 (c), reducing the voltage of the source terminal connected to the load 1 (hereinafter referred to as the output voltage) Vout over a time period of time t2 to t3. Generally, the time from the moment when the drive signal is changed from High to Low to that when the output voltage Vout starts reduction is called the off-time Toff, while the time from the moment when the output voltage Vout starts reduction to that when it fully falls is called the fall time Tf, and from viewpoint of response the off-time Toff is preferably short, while the fall time Tf, from the viewpoint of noise (dV/dt), is not always required to be the shortest, and is determined on the compromise between the noise and the turn-off loss.

CITATION LIST

[Patent Literature]
  [Patent Document 1]
  Japanese Unexamined Patent Application Publication No. Hei 06-291631
  [Patent Document 2]
  Japanese Unexamined Patent Application Publication No. 2003-284318

However, with the aforementioned prior art, there is a problem that the rate of drawing the charge from the gate terminal of the power NMOS 2, in other words, the rate of discharging the gate terminal of the power NMOS 2 is fixed according to the current source 1, and thus the off-time Toff and the fall time Tf are uniquely determined by the current source 1, thereby the off-time Toff and the fall time Tf cannot be adjusted individually.

For the load driving circuit using an insulated-gate type bipolar transistor as a low side switch, there is proposed a technology which compares the collector voltage or the gate voltage of the insulated-gate type bipolar transistor with the reference voltage, and according to the result of the comparison, changes the rate of discharging the gate terminal for adjusting the off-time Toff and the fall time Tf individually (as disclosed in, for example, Patent Documents 1 and 2).

However, for the load driving circuit disclosed in Patent Documents 1 and 2, there is the need for providing a reference voltage generation circuit for generating a collector voltage or gate voltage to be compared with the voltage reference, resulting in a complicated circuit configuration.

In view of the aforementioned problems associated with the prior art, the present invention has been made to solve such problems and provide a load driving circuit in which, with a simple configuration, the off-time Toff and the fall time Tf can be optimized in turn-off operation of the N-channel type MOSFET used as a high side switch.

SUMMARY OF THE INVENTION

According to an aspect of the present invention, there is provided a load driving circuit using an N-channel type power MOSFET as a high side switch connected between a power supply and a load, comprising: a comparator circuit for comparing a gate voltage of the power MOSFET with a power-supply voltage of the power supply; and a shut-off circuit for discharging the gate terminal of the power MOSFET in turn-off operation of the power MOSFET; upon the gate voltage being lower than the power-supply voltage, the rate of discharging the gate terminal of the power MOSFET being slow, as compared to that provided upon the gate voltage being higher than the power-supply voltage.

According to another aspect of the present invention, there is provided a load driving circuit, wherein the shut-off circuit comprises a first resistor and a second resistor, and upon the gate voltage being higher than the power-supply voltage, the gate terminal of the power MOSFET is discharged through the first resistor and the second resistor, while, upon the gate voltage being lower than the power-supply voltage, the gate terminal of the power MOSFET is discharged through the second resistor alone.

According to another aspect of the present invention, there is provided a load driving circuit, wherein the comparator circuit comprises: a resistor, one end thereof being connected to the gate terminal of the power MOSFET; a diode, the anode thereof being connected to the other end of the resistor, and the cathode thereof being connected to the power supply; and a switching device including a P-channel type MOSFET, the junction point between the resistor and the diode being connected to the gate terminal thereof, and the gate terminal of the power MOSFET being connected to the source terminal thereof; the switching device in the comparator circuit opening/closing a path for current flowing through the first resistor.

According to another aspect of the present invention, there is provided a load driving circuit, wherein the shut-off circuit comprises a first current source and a second current source, and upon the gate voltage being higher than the power-supply voltage, the first current source and the second current source are used to discharge the gate terminal of the power MOSFET, while, upon the gate voltage being lower than the power-supply voltage, the second current source alone is used to discharge the gate terminal of the power MOSFET.

According to the present invention, if the gate voltage is lower than the power-supply voltage, the rate at which the shut-off circuit discharges the gate terminal of the power MOSFET is switched over to a slow one, as compared to the rate provided if the gate voltage is higher than the power-supply voltage, whereby, with a simple configuration, the off-time Toff and fall time Tf can be optimized in turn-off operation of the N-channel type MOSFET used as a high side switch.

DETAILED DESCRIPTION OF THE PREFERRED EMBODIMENTS (First Embodiment)

Figure 1:
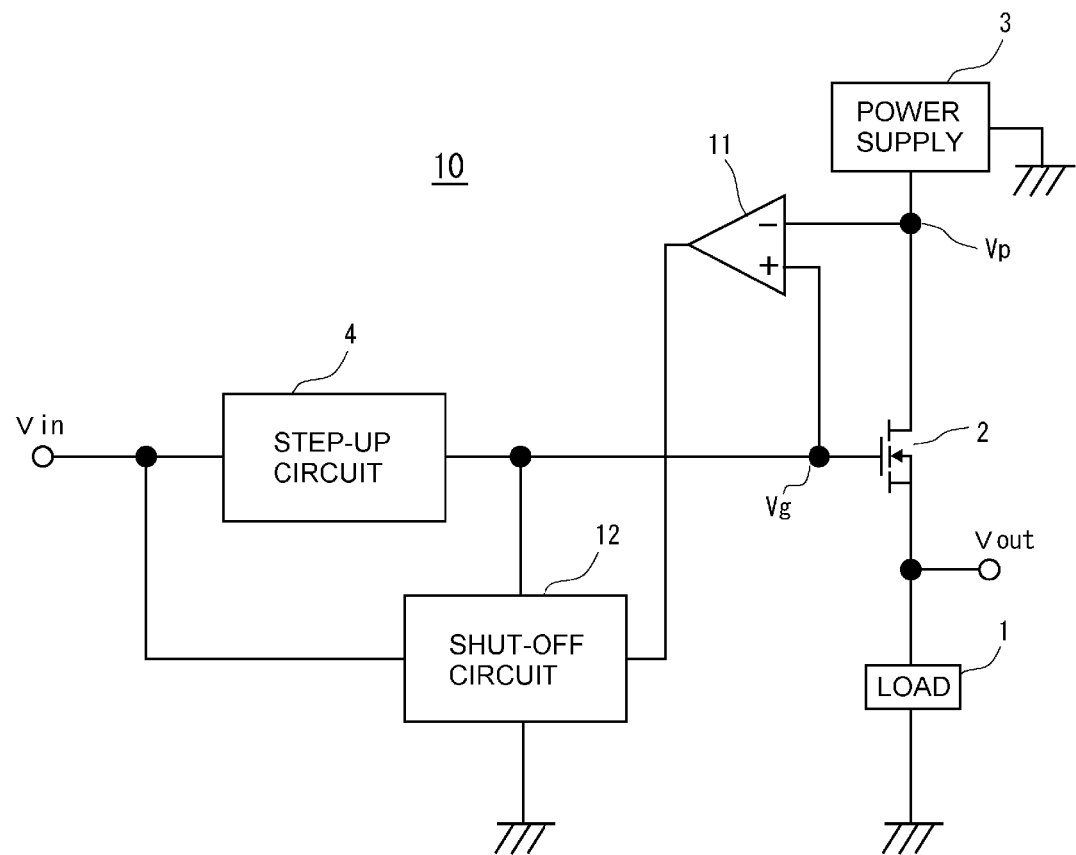
FIG. 1 is a block diagram illustrating the schematic configuration of a load driving circuit according to a first embodiment of the present invention.

FIG. 1 gives an example of the schematic configuration of a load driving circuit 10 according to a first embodiment using an N-channel type power MOSFET 2 (hereinafter referred to as a power NMOS 2) as a high side switch for driving a load 1, such as a lamp, a solenoid, or the like.

The load driving circuit 10 according to the first embodiment includes a power NMOS 2 as a high side switch for driving the load 1; a power supply 3 for supplying power; a voltage step-up circuit 4 for stepping up a drive signal Vin; a comparator 11 for comparing a power-supply voltage Vp of the power supply 3 with a gate voltage Vg of the power NMOS 2; and a shut-off circuit 12 for discharging the gate terminal of the power NMOS 2 to shut off the power NMOS 2 in turn-off operation.

To the drain terminal of the power NMOS 2, the power supply 3 is connected, and the source terminal of the power NMOS 2 is connected to the ground terminal through the load 1. In addition, the gate terminal of the power NMOS 2 is connected to the output terminal of the voltage step-up circuit 4, and into the input terminal of the voltage step-up circuit 4, a drive signal Vin for switching the power NMOS 2 on/off is input. The drive signal is a square wave changing between two levels of High and Low. When the drive signal Vin is changed to High, the voltage step-up circuit 4 starts charging the gate terminal until the gate voltage Vg of the power NMOS 2 reaches a voltage level higher than the power-supply voltage of the power supply 3 that is applied to the drain terminal. Thereby, the power NMOS 2 is turned on, being brought into the conducting state (the on state), current being supplied to the load 1. The voltage step-up circuit 4 functions as a drive circuit for turning the power NMOS 2 on.

The inverting input terminal of the comparator 11 is connected to the junction point between the power supply 3 and the drain terminal of the power NMOS 2, and the non-inverting input terminal of the comparator 11 is connected to the junction point between the gate terminal of the power NMOS 2 and the output terminal of the voltage step-up circuit 4. In addition, the output terminal of the comparator 11 is connected to the shut-off circuit 12, and the result of the comparison of the power-supply voltage Vp of the power supply 3 with the gate voltage Vg of the power NMOS 2 is output to the shut-off circuit 12.

Into the shut-off circuit 12, a drive signal Vin for switching the power NMOS 2 on/off is input, and when the drive signal Vin is changed to Low, the gate terminal of the power NMOS 2 is discharged, thereby turning off the power NMOS 2. Here, according to the result of the comparison by the comparator 11, the shut-off circuit 12 switches over the rate of discharging the gate terminal of the power NMOS 2. In other words, by switching over the discharge rate in two phases from high to low, the discharge rate is changed. Thereby, the gate voltage Vg of the power NMOS 2 in turn-off operation of the power NMOS 2 is abruptly reduced until it reaches a voltage level equal to the power-supply voltage Vp of the power supply 3, and thereafter it is slowly reduced, whereby the off-time Toff and fall time Tf can be optimized.

The turn-off operation of the power NMOS 2 in the load driving circuit 10 according to the first embodiment will be described in more detail with reference to FIG. 2.

Figure 2:
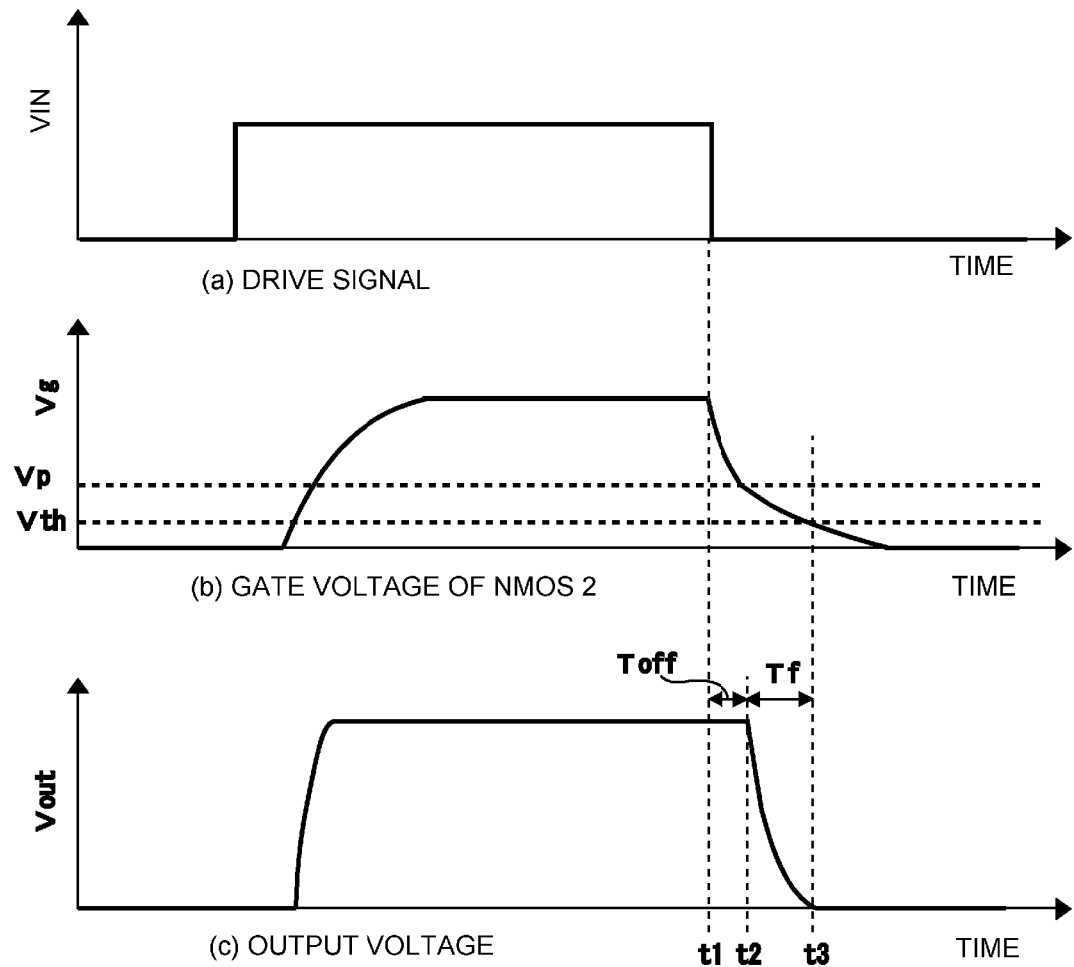
FIG. 2 is a waveform diagram illustrating a signal waveform and operation waveforms of the sections in FIG. 1.

As shown in FIG. 2 (a), when the drive signal Vin is changed to Low at time t1, the shut-off circuit 12 draws the charge from the gate terminal of the power NMOS 2, thereby, as shown in FIG. 2 (b), reducing the gate voltage Vg of the power NMOS 2. Here, the rate of discharging the gate terminal of the power NMOS 2 is switched over in two phases such that it is high when the gate voltage Vg of the power NMOS 2 is higher than the power-supply voltage Vp of the power supply 3 over a time period of time t1 to t2, while it is low when the gate voltage Vg of the power NMOS 2 is lower than the power-supply voltage Vp of the power supply 3 over a time period of time t2 to t3. Thereby, the gate voltage Vg of the power NMOS 2 is abruptly reduced until it reaches a voltage level equal to the power-supply voltage Vp, and thereafter, it is reduced slowly.

In this way, by switching over the rate of discharging the gate voltage Vg of the power NMOS 2, the off-time Toff, which is the time period from the moment when the drive signal Vin is changed from High to Low to that when the output voltage Vout starts lowering, can be shortened.

Next, when, as shown with time t3 in FIG. 2 (*c*), the gate voltage Vg is reduced to close to the threshold voltage Vth of the power NMOS 2, the power NMOS 2 is shut off. In a time period as shown with time t2 to t3, the voltage of the source terminal connected to the load 1 (hereinafter referred to as the output voltage) Vout is reduced according to the gate voltage Vg of the power NMOS 2. When the gate voltage Vg of the power NMOS 2 is reduced to below the power-supply voltage Vp, the shut-off circuit 12 switches over the rate of discharging the gate terminal of the power NMOS 2 to a slow one, thereby making the rate of reduction of the gate voltage Vg slower, and also the rate of change of the output voltage Vout slower.

In this way, by switching over the rate of discharging the gate terminal of the power NMOS 2, the off-time Toff, which is the time from the moment when the drive signal is changed to Low to that when the output voltage Vout starts reduction, alone can be shortened without changing the fall time Tf, which is the time from the moment when the output voltage Vout starts reduction to that when it fully falls.

Figure 3:
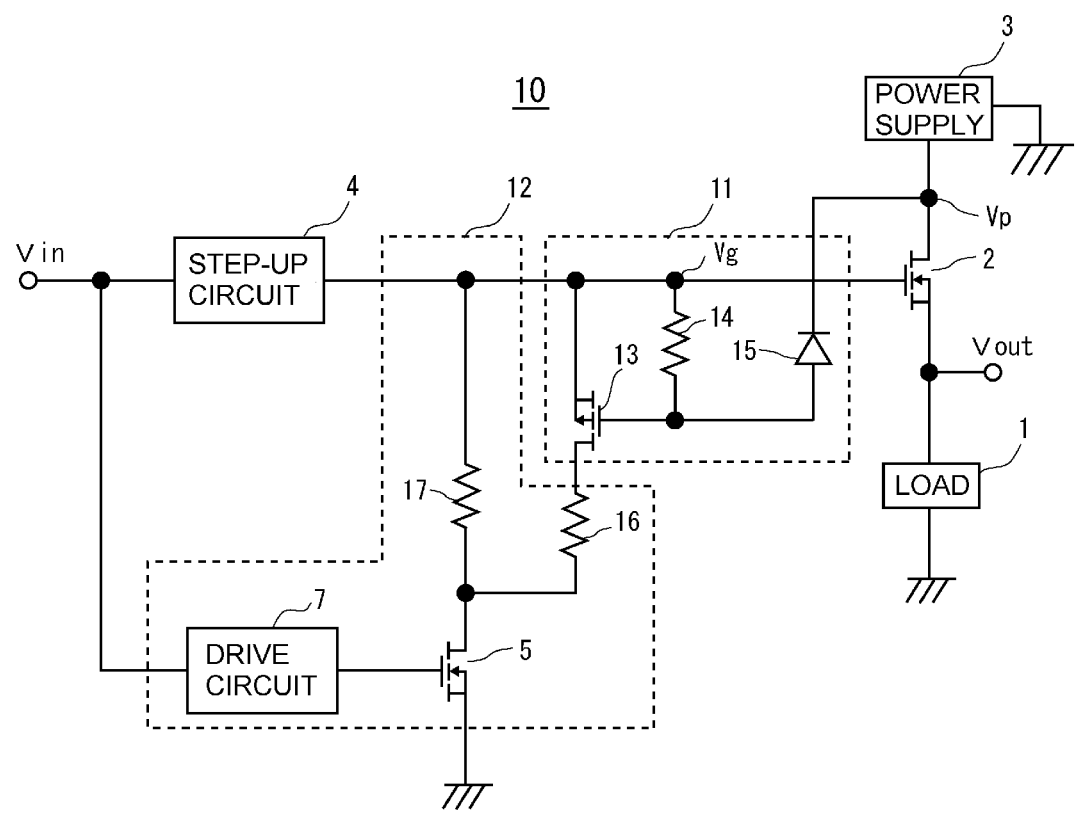
FIG. 3 is a circuit configuration diagram illustrating a specific circuit configuration of the comparator circuit and shut-off circuit shown in FIG. 1.

FIG. 3 shows a specific circuit configuration of the comparator circuit 11 and shut-off circuit 12.

As shown in FIG. 3, the comparator circuit 11 includes a P-channel type MOSFET (hereinafter referred to as a PMOS) 13, a resistor 14, and a diode 15.

In the comparator circuit 11, the source terminal of the PMOS 13 is connected to the gate terminal of the power NMOS 2, and the resistor 14 is connected between the gate terminal of the PMOS 13 and the gate terminal of the power NMOS 2. In addition, the junction point between the gate terminal of the PMOS 13 and the resistor 14 is connected to the anode of the diode 15, and the cathode of the diode 15 is connected to the junction point between the drain terminal of the power NMOS 2 and the power supply 3.

If the gate voltage Vg of the power NMOS 2 is higher than the power-supply voltage Vp of the power supply 3, the diode 15 is biased in the forward direction, current flows from the gate terminal of the power NMOS 2 through the resistor 14 and the diode 15. Accordingly, the gate voltage Vg of the PMOS 13 is biased negative with respect to the source voltage, thereby the PMOS 13 being brought into the conducting state. On the other hand, if the gate voltage Vg of the power NMOS 2 is lower than the power-supply voltage Vp of the power supply 3, the diode 15 is biased in the reverse direction, thereby no current flowing through the resistor 14, the gate voltage Vg of the PMOS 13 and the source voltage thereof being made equipotential, thereby the PMOS 13 being brought into the non-conducting state.

The shut-off circuit 12 includes an NMOS 5, a drive circuit 7, a first resistor 16, and a second resistor 17.

The drain terminal of the NMOS 5 and the drain terminal of the NMOS 13 is connected to each other through the first resistor 16, and the drain terminal of the NMOS 5 and the gate terminal of the power NMOS 2 is connected to each other through the second resistor 17. In addition, the source terminal of the NMOS 5 is connected to the ground terminal, and the gate terminal thereof is connected to the output terminal of the drive circuit 7.

The drive circuit 7 is a circuit, such as an inverter, or the like, for outputting a signal obtained by inverting the drive signal Vin, and when the drive signal Vin is changed to Low, the drive circuit 7 drives the NMOS 5 into the conducting state. When the NMOS 5 is in the conducting state, current flows through the first resistor 16 and the second resistor 17, thereby drawing the charge from the gate terminal of the power NMOS 2. At this time, the rate at which the gate voltage Vg of the power NMOS 2, in other words, the rate of discharging the gate terminal of the power NMOS 2 is determined by the size of the first resistor 16 and the second resistor 17 (the combined resistance value of the first resistor 16 and the second resistor 17). Immediately after the drive signal Vin having been changed from High to Low, the gate voltage Vg of the PMOS 13 is biased negative with respect to the source voltage, the PMOS 13 being in the conducting state, thereby current flowing from the gate terminal of the power NMOS 2 through the first resistor 16.

When the charge is drawn from the gate terminal of the power NMOS 2, thereby the gate voltage Vg of the power NMOS 2 being lowered to below the power-supply voltage Vp of the power supply 3, the gate voltage Vg of the PMOS 13 and the source voltage thereof are made equipotential, thereby the PMOS 13 being brought into the non-conducting state. Thus, the operation of discharging the gate terminal of the power NMOS 2 is switched over to that from the second resistor 17 alone. Accordingly, the rate of discharging the gate terminal of the power NMOS 2 is switched over from that on the combined resistance value of the first resistor 16 and the second resistor 17 to that on the resistance value of the second resistor 17 to be thereby changed to a slower one.

In this way, until the gate voltage Vg of the power NMOS 2 reaches a voltage level equal to the power-supply voltage Vp of the power supply 3, the rate at which the gate voltage Vg of the power NMOS 2 is reduced is determined by the combined resistance value of the first resistor 16 and the second resistor 17, while, after the gate voltage Vg of the power NMOS 2 having reached a voltage level equal to the power-supply voltage Vp of the power supply 3, the rate at which the gate voltage Vg of the power NMOS 2 is reduced is determined by the resistance value of the second resistor 17. Therefore, by adjusting the resistance value of the first resistor 16 and the second resistor 17, the off-time Toff and the fall time Tf can be optimized. The combined resistance value of the first resistor 16 and the second resistor 17 is smaller than the resistance value of the second resistor 17 alone, and thus the off-time Toff can be made shorter, while the fall time Tf can be made longer relative to the off-time Toff, or in other words, the fall time Tf in the conventional circuit can be held as it is.

(Second Embodiment)

Figure 4:
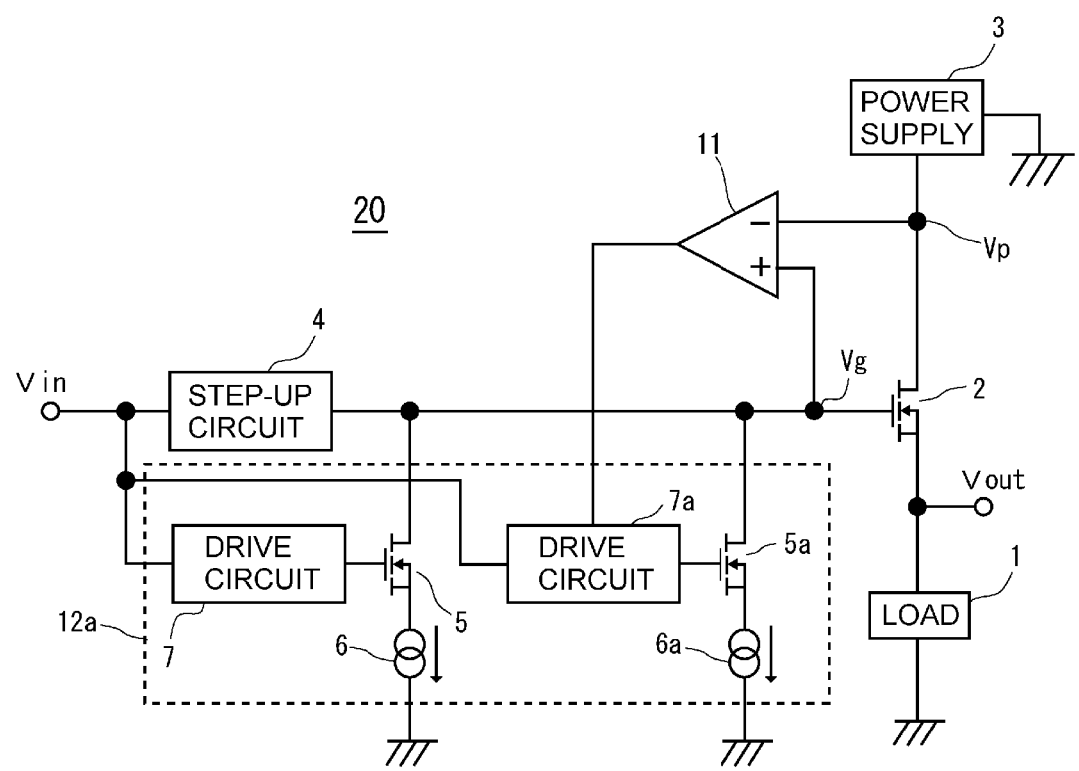
FIG. 4 is a block diagram illustrating the schematic configuration of a load driving circuit according to a second embodiment of the present invention.
Figure 5:
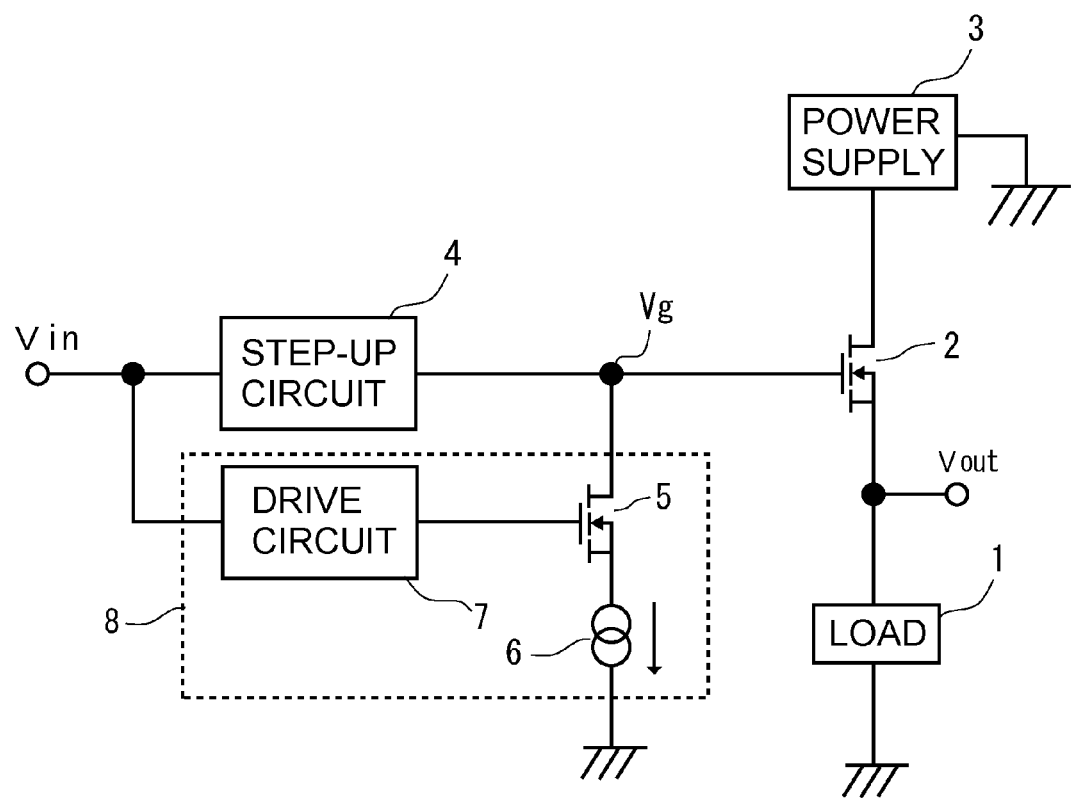
FIG. 5 (Prior Art) is a block diagram illustrating the schematic configuration of a conventional load driving circuit.
Figure 6:
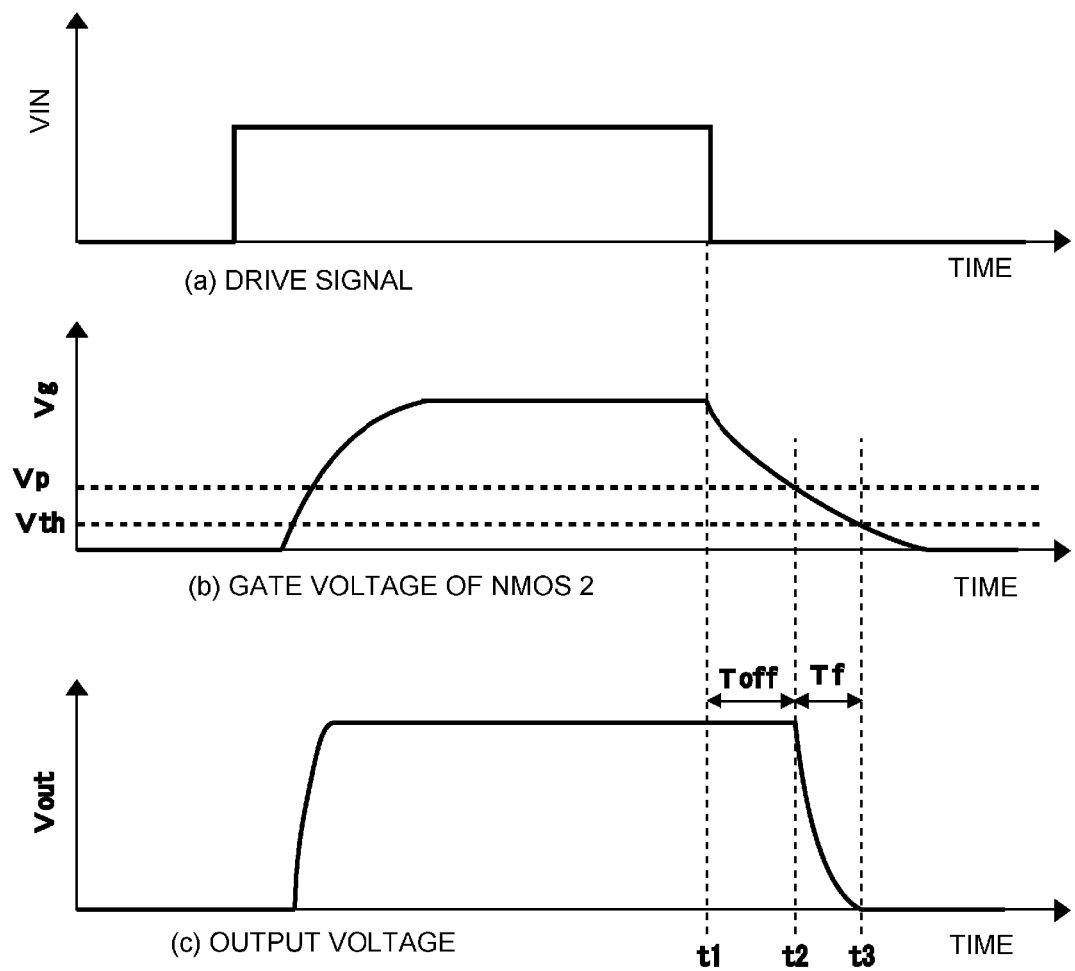
FIG. 6 (Prior Art) is a waveform diagram illustrating a signal waveform and operation waveforms of the sections in FIG. 5.

FIG. 4 gives an example of the schematic configuration of a load driving circuit 20 according to a second embodiment using an N-channel type power NMOS 2 as a high side switch for driving a load 1, such as a lamp, a solenoid, or the like.

The load driving circuit 20 according to the second embodiment adopts a shut-off circuit 12*a*, which is a modification of the configuration of the shut-off circuit 12 in the load driving circuit 10 according to the first embodiment.

The shut-off circuit 12*a* includes an NMOS 5, 5*a*, a current source 6, 6*a*, and a drive circuit 7, 7*a*. The drain terminal of the NMOS 5 is connected to the junction point between the gate terminal of the power NMOS 2, and the output terminal of the voltage step-up circuit 4; the source terminal of the NMOS 5 is connected to the ground terminal through the current source 6; and the gate terminal of the NMOS 5 is connected to the output terminal of the drive circuit 7. In addition, the drain terminal of the NMOS 5*a* is connected to the junction point between the gate terminal of the power NMOS 2 and the output terminal of the voltage step-up circuit 4; the source terminal of the NMOS 5*a* is connected to the ground terminal through the current source 6*a*; and the gate terminal of the NMOS 5*a* is connected to the output terminal of the drive circuit 7*a*. Further, into the drive circuit 7, 7*a*, a drive signal Vin is input, and the drive circuit 7a is connected to the output terminal of the comparator 11.

The drive circuit 7 is a circuit, such as an inverter, or the like, for outputting a signal obtained by inverting the drive signal Vin, and when the drive signal Vin is changed to Low, the drive circuit 7 drives the NMOS 5 into the conducting state. In addition, the drive circuit 7a includes a circuit, such as an inverter, or the like, for outputting a signal obtained by inverting the drive signal Vin, and an AND circuit for taking the logical sum of the output of the comparator 11 and the signal obtained by inverting the drive signal Vin, and if the drive signal Vin is changed to Low and the output of the comparator 11 is changed to High, in other words, the gate voltage Vg of the power NMOS 2 is higher than the power-supply voltage Vp of the power supply 3, the NMOS 5a is brought into the conducting state.

Thereby, until the drive signal Vin is changed to Low, and the gate voltage Vg of the power NMOS 2 reaches a voltage level equal to the power-supply voltage Vp of the power supply 3, the current source 6 and the current source 6a discharge the gate terminal of the power NMOS 2, and after the gate voltage Vg of the power NMOS 2 having reached a voltage level equal to the power-supply voltage Vp of the power supply 3, the current source 6 alone discharges the gate terminal of the power NMOS 2. Accordingly, by adjusting the current source 6 and the current source 6a, the off-time Toff and the fall time Tf can be optimized. The discharge rate provided if the current source 6 and the current source 6a are used is higher than the discharge rate provided if the current source 6 alone is used, and thus the off-time Toff can be made shorter, while the fall time Tf can be made longer relative to the off-time Toff.

Heretofore, the preferred embodiments of the present invention has been explained, however, those embodiments are only exemplifications, and various changes and modifications thereof may be made without departing from the spirit and the scope thereof.

What is claimed is:

1. A load driving circuit using an N-channel type power MOSFET as a high side switch connected between a power supply and a load, comprising:

a comparator circuit for comparing a gate voltage of the power MOSFET with a power-supply voltage of the power supply; and a shut-off circuit for discharging the gate terminal of the power MOSFET in turn-off operation of the power MOSFET, the shut-off circuit including a first resistor, a second resistor, and an switching device having an N-channel type MOSFET, upon the gate voltage being higher than the power-supply voltage, the N-channel type MOSFET being turned on for discharging the gate terminal of the power MOSFET through the first resistor and the second resistor, while, upon the gate voltage being lower than the power-supply voltage, the gate terminal of the power MOSFET being discharged through the second resistor alone, the comparator circuit including:

a resistor, one end thereof being connected to the gate terminal of the power MOSFET;

a diode, the anode thereof being connected to the other end of the resistor, and the cathode thereof being connected to the power supply; and a switching device including a P-channel type MOSFET, the gate terminal thereof being connected to the junction point between the resistor and the diode, and the source terminal thereof being connected to the gate terminal of the power MOSFET, one end of the first resistor being connected to the drain terminal of the switching device including a P-channel type MOSFET and the other end of the first resistor being connected to the drain terminal of the N-channel type MOSFET, the drain terminal of the N-channel type MOSFET being connected to the gate terminal of the power MOSFET through the second resistor, upon the gate voltage being lower than the power-supply voltage, the rate of discharging the gate terminal of the power MOSFET being slow, as compared to that provided upon the gate voltage being higher than the power-supply voltage.

* * * * *